United States Patent [19]

Lambert

[11] Patent Number: 4,857,743
[45] Date of Patent: Aug. 15, 1989

[54] DISPOSABLE SPRAY APERTURE

[75] Inventor: Kenneth Lambert, North Reading, Mass.

[73] Assignee: ElectroScan Corporation, Danvers, Mass.

[21] Appl. No.: 229,158

[22] Filed: Aug. 4, 1988

[51] Int. Cl.$^4$ .............................................. H01V 37/09
[52] U.S. Cl. .............................. 250/505.1; 250/503.1; 250/310; 250/311; 250/307
[58] Field of Search ................ 250/505.1, 503.1, 306, 250/307, 310, 311; 42/90, 95

[56] References Cited

U.S. PATENT DOCUMENTS 3,286,293 11/1966 Eckert ...................................... 42/95
3,787,696 1/1974 Dao et al. ............................. 250/310
4,445,040 4/1984 Iwasaki et al. ................... 250/505.1

Primary Examiner—Jack I. Berman
Attorney, Agent, or Firm—Curtis, Morris & Safford

[57] ABSTRACT

A spray aperture disk designed for insertion into a column liner of an electron microscope having a substantially circular shape, a plurality of tabs or extensions located on the circumferential periphery of the disk and a small central aperture. The disk is inserted into the tapered end of a column liner and then deformed by a tool which pushes the disk into position within the column liner. The disk may be removed by inserting a rod of appropriate length and width into the column liner and pushing the disks out. The disks are self centering and require no separate carrier. The disks are made from inexpensive materials and are disposable.

20 Claims, 2 Drawing Sheets

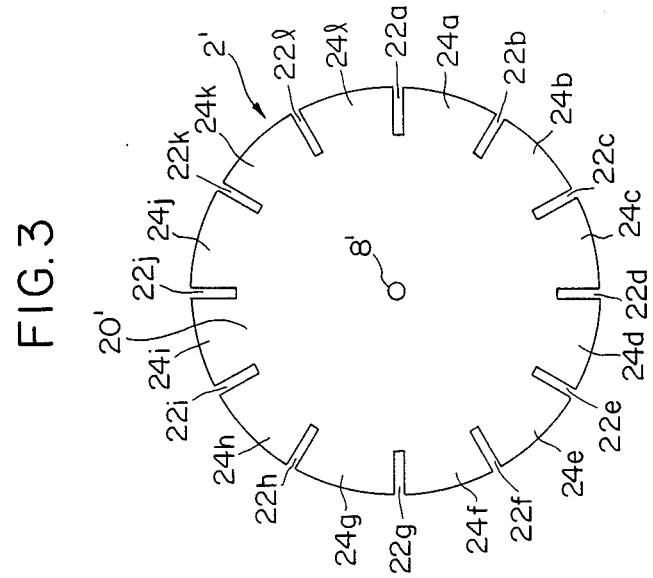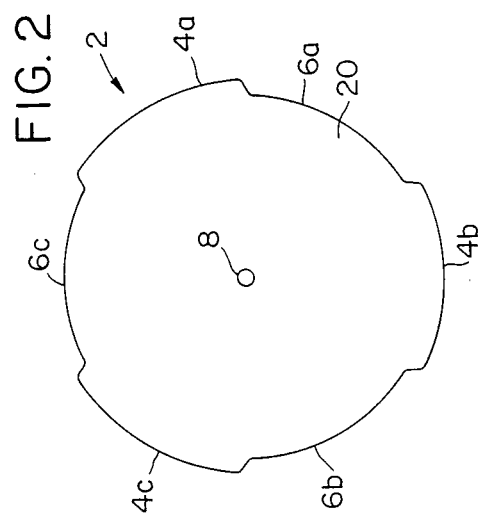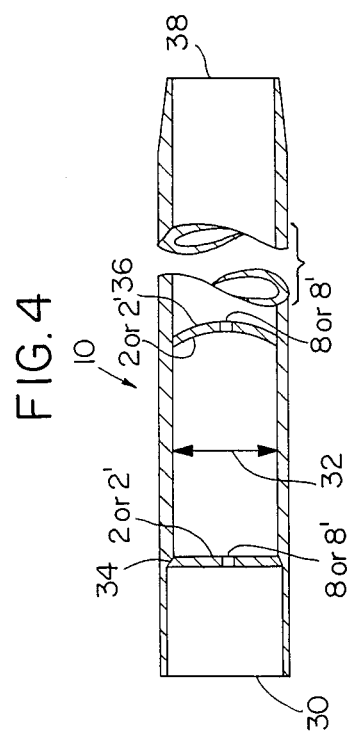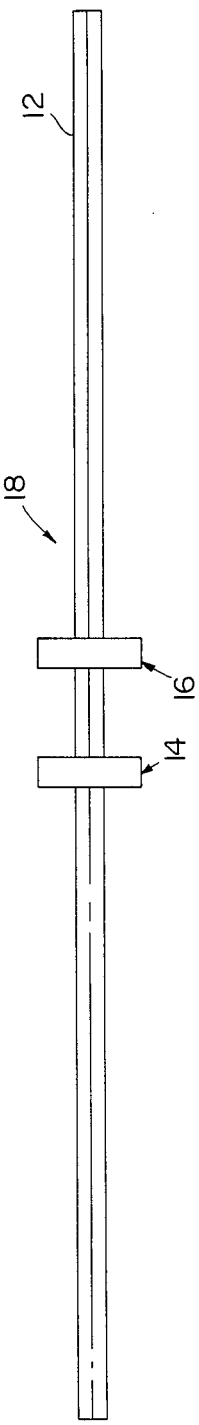

DISPOSABLE SPRAY APERTURE

BACKGROUND OF THE INVENTION

1. Field of the Invention

The invention relates generally to electron spray aperture disks for use in electron microscopes and, more particularly, to disposable aperture disks for use in column liners in scanning electron microscopes.

2. Description of the Prior Art

The scanning electron microscope is a versatile and widely used tool of modern science. It can produce images over a wide range of magnifications and, in general, the magnification is far greater than that provided by the most advanced light microscopes.

In an electron microscope a beam of electrons is used instead of light as the source of illumination. The electron beam interacts with a specimen to yield a high resolution image of the specimen's surface.

The scanning electron microscope uses a focused beam of high energy electrons that systematically scans across the surface of a specimen. The interaction of the beam with the specimen produces a large number of signals at or near the specimen's surface. Low energy, or secondary electrons, are collected by a positively biased detector system. This electron signal is then converted to an electronic signal which is displayed on a cathode ray tube.

Structurally, the typical scanning electron microscope is composed of an electron gun assembly which produces a primary electron beam; electromagnetic lens and apertures, which focus the primary beam on the specimen; a vacuum system which allows free passage of the electron beam through a column without interference with air molecules; a specimen stage for holding the specimen in an optimum viewing position; and signal detection and display components, which permit the viewing of enlarged images of the specimen.

Surfaces of the several components exposed to the electron beam must be periodically cleaned and most electron microscopes include removable column liner tubes, through which the electrons pass, to simplify maintenance. The column liners pass through the bores of the magnetic lens and typically contain one or more removable metal aperture disks. These aperture disks have a small centrally located aperture. The aperture disks are located at critical positions within the column liner and serve to block off-axis beam electrons from reaching the specimen. Aperture disks, sometimes loosely called "spray apertures", are usually precision machined 3 mm platinum disks with very small central holes. They are placed in spring-loaded metal holders which are then slid into the column liner from one end. Such platinum aperture disks are expensive, but are capable of being cleaned and re-used. In order for these apertures to function properly they must also be able to be centered prior to insertion in the column liner, since once in the column liner they cannot be externally adjusted.

OBJECTS OF THE INVENTION

A primary object of the present invention is to provide an inexpensive electron spray aperture disk for insertion into a column liner of an electron microscope.

Another object of the invention is to provide a disposable spray aperture disk for a scanning electron microscope which is completely self-centering.

An additional object of the invention is to provide a disposable spray aperture disk for an electron microscope which is easily manufactured from inexpensive materials.

Yet a further object of the invention is to provide a disposable spray aperture disk for an electron microscope which requires no separate carrier or mounting.

A still further object in the invention is to provide a disposable spray aperture disk for an electron microscope which may be easily placed within a column liner at an exact location using a simple tool.

SUMMARY OF THE INVENTION

The flexible electron spray aperture disk of the invention consists of a thin, flat, substantially circular, metal disk having a small aperture in the center. In one embodiment, the disk has several relatively large extensions or tabs spaced around the circumferential periphery of the disk. In another embodiment the thin, flat, flexible, metal disk has a series of evenly spaced radial slits extending inwardly from the circumferential periphery of the disk. These slits define small tabs along the periphery of the disk.

The aperture disks of both embodiments are made of thin metal so that they are flexible. The total diameter of the disk is typically approximately 6 mm, although the disk can be made in any size in order for it to fit within a column liner. The diameter of the small center hole normally ranges from 200 microns to 1000 microns, but again, any desired size hole may be used. The outermost diameter of the disk measured at the extensions or tabs is greater than the internal diameter of the column liner where the aperture is to be finally positioned.

In use, the disk is slipped into the column liner which may be slightly tapered at one or both ends such that its inner diameter increases toward that end. The diameter of the disk is slightly smaller than the tapered diameter of the column liner and slightly larger than the "normal" untapered diameter of the column liner. The disk falls freely into the column liner until the extensions of the first embodiment or the tabs of the second embodiment encounter a portion of the liner having the same diameter. A simple tool is then employed to properly position the spray aperture disk within the column liner. The aperture disk under pressure from the cylindrical rod of the installation tool, then deforms into a dome shape with the center of the disk becoming the axially most extended portion. This deformation, which effectively reduces the diameter of the disk, allows the spray aperture disk to slide further into the column liner.

In order to position the spray aperture disk of the invention within the column liner, a tool comprising a rod having a diameter slightly less than that of the column liner is used to push the spray aperture disk into place. This rod may be marked with a measurement grid so that the exact distance the aperture disk is placed in the column liner can be determined. Optimally, the rod is fitted with one or two collars, which can be set at the exact distance an aperture disk must be pushed into the column liner. The rod is used to push first one and then a second spray aperture into the column liner until the collar(s) abuts the edge of the end of the column liner, thus insuring exact placement.

The disposable spray aperture disks of the invention may be removed from the column liner by simply pushing them, with a rod of appropriate diameter and length, all the way through the column liner until they come out the other end. The spray aperture disks may, if appropriate, be discarded and new apertures inserted as needed.

The flexible spray aperture disks are self-centering because of the symmetry of the extensions or tabs. Thus, there is no need to take further steps to insure the exact location of the disk and there is no need for mounting structures, or the like, to carry and center the aperture disk.

Since the disks can be manufactured cheaply from inexpensive materials, they are disposable. The time consuming task of cleaning and carefully replacing platinum spray aperture disks is not necessary.

BRIEF DESCRIPTION OF THE DRAWINGS

FIG. 2 is a top view of one embodiment of the disposable spray aperture disk of the invention;

FIG. 3 is a top view of another embodiment of the disposable spray aperture disk of the invention;

FIG. 4 is a side elevation view of a spray aperture disk of the present invention disposed in a column liner both at its point of initial contact with the interior walls of the column liner and in its deformed shape;

FIG. 5 is a side elevation view of the spray aperture disk insertion tool of the invention.

DETAILED DESCRIPTION OF THE PREFERRED EMBODIMENTS

Figure 1:
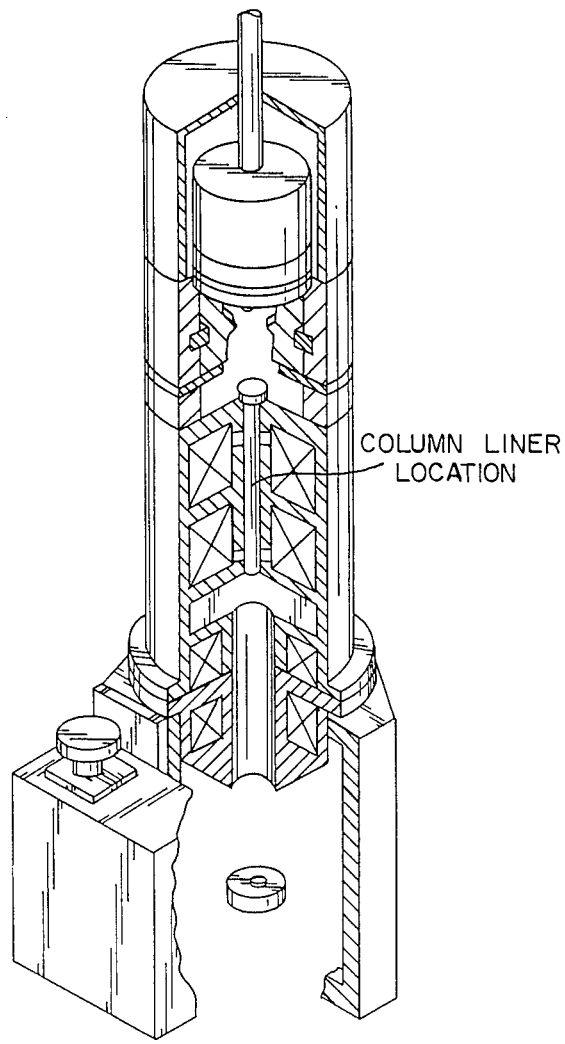
FIG. 1 is a front perspective view with a cut-away of a typical scanning electron microscope having a column liner.

As shown in FIG. 2, the spray aperture disk 2 of one embodiment of the invention is essentially a flat disk 20 with a small aperture 8 in the center. Three extensions, 4a, 4b and 4c are spaced equidistantly around the circumferential periphery of disk 20. These extensions uniformly increase the effective diameter of the disk throughout their arc length. The arcs of extensions 4a, 4b and 4c are concentric with inner central aperture 8. Three areas of lesser diameter 6a, 6b and 6c make up the remainder of the circumferential periphery of disk 20. These three areas of lesser diameter are also spaced equidistantly around the periphery of disk 20. The arcs of areas 6a, 6b and 6c are concentric with inner central aperture 8.

As shown in FIG. 3, the spray aperture disk 2' of another embodiment of the invention is also a flat disk 20' with a small aperture 8' in the center. A series of twelve evenly spaced radial slits 22a-1 extend inwardly from the periphery of disk 20'. These slits 22a-1 define twelve tabs 24a-1 which are evenly spaced on the circumferential periphery of the disk.

The spray aperture disk 2 or 2' is manufactured from very thin copper or bronze or other nonmagnetizing metal. The thinness of disk 20 or 20' renders it flexible. Typically, the thickness of the disks 20 or 20' is from 100 to 200 microns. The disk 20 or 20' is preferably fabricated by a metal photo-etching technique. It is then gold plated to prevent it from tarnishing or oxidizing. The hole 8 or 8' in the center of disk 20 or 20' typically ranges in size from 200 microns to 1,000 microns but may be made any size necessary to accommodate the needs of the electron microscope. The overall diameter of the disk 20 or 20' is typically approximately 6 mm but may be larger or smaller to fit any size column liner.

The overall diameter of the disk 20 or 20', measured to the outermost edge of the tab or extension, is slightly greater than the "normal" diameter of a column liner 10. Typically, the disk diameter may be from 3 to 5% greater than the "normal" diameter of the column liner.

With reference to FIG. 4, in order to deploy spray aperture disk 2 or 2' within column liner 10, end 30 of column liner 10 has a larger interior diameter which tapers inwardly so that the diameter of column liner 10 gradually decreases until it reaches a "normal" diameter 32. Spray aperture disk 2 or 2' is placed inside column liner 10 before column liner 10 is inserted into an electron microscope. It falls into column liner 10 until the outer diameter of the spray aperture disk 2 or 2' matches the interior diameter of column liner 10 as shown at reference numeral 34. In order to deploy spray aperture disk 2 or 2' in a final position within column liner 10, the disk 20 or 20' must be deformed into a dome shape. This deformation effectively decreases the overall diameter of the disk and thus facilitates movement of the disk 20 or 20' through the column liner 10 to a position 36. When the spray aperture disk 2 or 2' is deformed, the central hole 8 or 8' effectively becomes the apex of spray aperture disk 2 or 2'. The extensions 4a, 4b and 4c of the first embodiment and the tabs 24a-1 of the second embodiment serve to flexibly lock the disk into place.

In the first embodiment, when the spray aperture disk 2 is deployed in column liner 10, the lesser diameter areas 6a, 6b and 6c are spaced slightly away from the wall of the column liner 10. This permits gas to flow between the inner wall of column liner 10 and edges 6a, 6b and 6c so that the vacuum in the column liner can be maintained without interference from spray aperture disk 2. In the second embodiment, the narrow slits 22a-1 between the tabs 24a-1 perform the same function.

The spray aperture disk 2 or 2' of the invention may be placed at the correct position within the column liner 10 by the use of a simple tool 18 shown in FIG. 5. The tool 18 is essentially a rod 12 which may be provided with measurement markings. One or more adjustable placement marking collars 14 and 16 may be adjustably positioned on rod 12. In practice, spray aperture disk 2 or 2' is dropped into column liner 10. It falls until the diameter of column liner 10 matches the outside diameter of the disk 20 or 20'. The spray aperture disk 2 or 2' is then deformed into a dome shape by pushing it further into column liner 10 with rod 12. Spray aperture 2 or 2' is pushed into column liner 10 with rod 12 until placement marking collar 14 or 16 abuts the end of column liner 10. At that point the spray aperture disk 2 or 2' is in its proper position. The exact location of spray aperture disk 2 or 2' within the column liner 10 can be adjusted by moving collars 14 and 16 to the appropriate location on rod 12.

Customarily, two spray aperture disks 2 or 2' are placed in position within column liner 10. The first spray aperture disk 2 or 2', which must go farthest into the column liner 10, is pushed in with one side of rod 12 until placement marking collar 14 abuts the end of column liner 10. Then, rod 12 is turned around and the second spray aperture disk 2 or 2', which goes a lesser distance into column liner 10, is pushed in until the second placement marking collar 16 abuts the end of column liner 10. In employing this technique, collars 14 and 16 may be fixed or movably disposed on rod 12.

After the spray aperture disk(s) 2 or 2' are properly deployed within column liner 10, the column liner 10 is inserted into the bores of the magnetic lens (See FIG. 1 generally). This insertion is facilitated by the tapering of the external walls of column liner 10 at end 38. These walls are tapered so that the external diameter of the column liner 10 decreases toward end 38.

Spray aperture disk(s) 2 or 2' can be removed from column liner 10 by using a rod, not shown, of suitable diameter and length (thinner than the interior diameter 32 of column liner 10 and longer than column liner 10) to push the spray aperture disk 2 or 2' out end 38 of column liner 10. This ease of removal, and the ability to discard the spray aperture disk 2 or 2' after repeated use of the electron microscope, are substantial advantages over the prior art.

Although the invention has been described with reference to specific embodiments, neither the method of manufacture, the described dimensions, nor the materials mentioned should be construed as limited to the details disclosed.

I claim:

1. An electron spray aperture disk for use in the column liner of an electron microscope comprising: a substantially circular flexible disk having a central aperture and tab means, said tab means located on the circumferential periphery of said disk and designed to hold said aperture disk within said column liner, the outermost diameter of said disk at said tabs being greater than the internal diameter of the column liner where said aperture disk is to be positioned.

2. An aperture disk as recited in claim 1 which is self-centering within the column liner.

3. An aperture disk as recited in claim 1, wherein said disk is made from a nonmagnetizing metal.

4. An aperture disk as recited in claim 3, wherein said disk is gold plated.

5. An aperture disk as recited in claim 3, wherein said disk is made from copper or bronze.

6. An aperture disk as recited in claim 1, wherein said small central hole is in the range of 200 microns to 1000 microns in diameter.

7. An electron spray aperture disk for use in the column liner of an electron microscope comprising: a substantially circular flexible disk having a central aperture and a plurality of slits in the periphery of said disk, said plurality of slits forming a plurality of tabs, adapted to fix said aperture disk in said column liner while permitting gas to flow around the periphery of said disk in order to maintain a vacuum in said column liner.

8. An electron spray aperture disk for use in the column liner of an electron microscope comprising: a substantially circular flexible disk having a central aperture and a plurality of arcuate extensions located on the circumferential periphery of said disk concentric with said central aperture adapted to fix said aperture disk within said column liner while permitting gas to flow around said disk in order to maintain a vacuum in said column liner.

9. An aperture disk as recited in claim 8, having three arcuate extensions equally spaced around the periphery of said disk.

10. A method of inserting and positioning an electron spray aperture disk within a column liner of an electron microscope comprising the following steps:
    (a) selecting a column liner which is tapered at one end such that the interior diameter of said column liner narrows;
    (b) placing a disposable spray aperture disk comprising: a substantially circular flexible disk having a central aperture and tab means, said tab means located on the circumferential periphery of said disk and designed to hold said aperture disk within said column liner, the outermost diameter of said disk at said tabs being greater than the internal diameter of the column liner where said aperture disk is to be positioned, into said tapered end of said column liner and permitting it to fall into said column liner until its diameter substantially matches an inside diameter of said column liner; and
    (c) axially pushing and thereby deforming said aperture disk with a tool inserted into said column liner so that said disposable aperture moves into said column liner to the desired position.

11. A method as recited in claim 10, wherein a cylindrical rod having at least one placement marking collar thereon is used to push and deform said aperture disk until said placement marking collar on said tool abuts said tapered end of said column liner.

12. A method as recited in claim 11, further comprising the steps of:
    (a) placing a second spray aperture into said tapered end of said column liner;
    (b) reversing said tool such that the opposite end of said cylindrical rod contacts said second spray aperture; and
    (c) axially pushing and deforming said second spray aperture into said column liner until a said placement marking collar abuts said tapered end of said column liner.

13. A method for removing an electron spray aperture disk from a column liner of an electron microscope comprising the steps of:
    (a) selecting a cylindrical rod having a diameter less than the interior diameter of said column liner and having a length greater than that of said column liner;
    (b) inserting said rod into the end of said column liner through which said spray aperture disk was originally inserted; and
    (c) pushing said rod through said column liner so that said spray aperture disk is pushed out the opposite end of said column liner.

14. A column liner for an electron microscope comprising: a hollow tube of restricted length having first and second ends wherein the interior diameter of said first end of said hollow tube tapers such that the interior diameter decreases inwardly and wherein the exterior diameter of said second end of said hollow tube tapers such that the exterior diameter decreases toward said second end.

15. A kit for inserting, positioning and removing an electron spray aperture disk disposed within a column liner of an electron microscope comprising:
    (a) a substantially circular flexible disk having a central aperture and tab means, said tab means located on the circumferential periphery of said disk and designed to hold said aperture disk in said column liner, the outermost diameter of said disk at said tabs being greater than the internal diameter of the column liner where said aperture disk is to be positioned; and
    (b) a tool, insertable in said column liner for pushing, positioning and/or removing said electron spray aperture disk within said column liner comprising a cylindrical rod smaller in diameter than said column liner having at least one placement marking collar thereon.

16. A kit as recited in claim 15, further including a rod, having a length greater than said column liner and a width narrower than said column liner for pushing said aperture disk out of said column liner.

17. A kit for inserting, positioning and removing at an electron spray aperture disk disposed within a column liner of an electron microscope comprising:
  (a) a column liner tapered at one end so that the interior diameter of said column liner narrows;
  (b) a substantially circular flexible disk having a central aperture and tab means, said tab means located on the circumferential periphery of said disk and designed to hold said aperture disk within said column liner, the outermost diameter of said disk at said tabs being greater than the internal diameter of the column liner where said aperture disk is to be positioned; and
  (c) a tool, insertable in said column liner for pushing, positioning and/or removing said electron spray aperture disk within said column liner comprising a cylindrical rod smaller in diameter than said column liner having at least one placement marking collar thereon.

18. A kit as recited in claim 17, further including a rod, having a length greater than said column liner and width less than said column liner for pushing said aperture disk out of said column liner.

19. An electron microscope containing a column liner for passage of electrons said column liner having removably affixed therein an electron spray aperture disk comprising a substantially circular flexible disk having a central aperture and tab means, said tab means located on the circumferential periphery of said disk and designed to hold said aperture disk within said column liner, the outermost diameter of said disk at said tabs being greater than the internal diameter of the column liner where said aperture disk is to be positioned.

20. A sub-component of an electron microscope comprising:
  (a) a column liner for passage of electrons, said column liner having removably affixed therein an electron spray aperture disk comprising a substantially circular flexible disk having a central aperture and tab means, said tab means located on the circumferential periphery of said disk and designed to hold said aperture disk within said column liner, the outermost diameter of said disk at said tabs being greater than the internal diameter of the column liner where said aperture disk is to be positioned.

* * * * *